United States Patent
Suzuki

(10) Patent No.: US 9,941,453 B2
(45) Date of Patent: Apr. 10, 2018

(54) LIGHT EMITTING DEVICE AND METHOD FOR MANUFACTURING THE SAME

(71) Applicant: NICHIA CORPORATION, Anan-shi, Tokushima (JP)

(72) Inventor: Ryo Suzuki, Anan (JP)

(73) Assignee: NICHIA CORPORATION, Anan-Shi (JP)

(*) Notice: Subject to any disclaimer, the term of this patent is extended or adjusted under 35 U.S.C. 154(b) by 0 days.

(21) Appl. No.: 15/164,360

(22) Filed: May 25, 2016

(65) Prior Publication Data

US 2016/0351765 A1 Dec. 1, 2016

(30) Foreign Application Priority Data

May 26, 2015 (JP) .................................. 2015-106547

(51) Int. Cl.
*H01L 33/00* (2010.01)
*H01L 33/60* (2010.01)
(Continued)

(52) U.S. Cl.
CPC .......... *H01L 33/60* (2013.01); *H01L 33/0095* (2013.01); *H01L 33/50* (2013.01);
(Continued)

(58) Field of Classification Search
CPC ...... H01L 33/0095; H01L 33/50; H01L 33/56
(Continued)

(56) References Cited

U.S. PATENT DOCUMENTS 8,680,552 B2 * 3/2014 Cho ...................... H01L 33/486
257/98
2012/0138998 A1 * 6/2012 Itou ....................... H01L 33/507
257/98

(Continued)

FOREIGN PATENT DOCUMENTS

JP 2010-157638 A 7/2010
JP 2010-219324 A 9/2010
(Continued)

*Primary Examiner* — Tan N Tran
(74) *Attorney, Agent, or Firm* — Foley & Lardner LLP

(57) ABSTRACT

A light emitting device includes a light emitting element having a first face positioned on an emission face side of the light emitting device, a second face opposing the first face, and lateral faces disposed between the first face and the second face, a light transmissive member formed from a resin-containing material, covering at least a portion of the lateral faces of the light emitting element and having a first face positioned on the emission face side, a covering member covering an exterior of the light transmissive member and having a first face positioned on the emission face side, a wavelength converting member covering the first face of the light emitting element, the first face of the light transmissive member, and the first face of the covering member, and a light reflective film including a first reflective film portion made of an inorganic material disposed between the exterior of the light transmissive member and the covering member, and a second reflective film portion made of an inorganic material disposed between the first face of the covering member and the wavelength converting member.

6 Claims, 12 Drawing Sheets

(51) Int. Cl.
*H01L 33/56* (2010.01)
*H01L 33/50* (2010.01)

(52) U.S. Cl.
CPC ...... *H01L 33/56* (2013.01); *H01L 2933/0033* (2013.01); *H01L 2933/0041* (2013.01); *H01L 2933/0058* (2013.01)

(58) Field of Classification Search
USPC ............................................ 257/98, 99, 100
See application file for complete search history.

(56) References Cited

U.S. PATENT DOCUMENTS

| | | | |
|---|---|---|---|
| 2012/0170277 A1* | 7/2012 | Tamura | C08G 69/265 362/296.02 |
| 2013/0015483 A1 | 1/2013 | Shimokawa et al. | |
| 2014/0220714 A1 | 8/2014 | Sorimachi | |

FOREIGN PATENT DOCUMENTS

| | | |
|---|---|---|
| JP | 2012-227470 A | 11/2012 |
| JP | 2013-012545 A | 1/2013 |
| JP | 2013-021175 A | 1/2013 |
| JP | 2013-219397 A | 10/2013 |
| JP | 2014-082525 A | 5/2014 |
| JP | 2015-026871 A | 2/2015 |
| JP | 2015-122452 A | 7/2015 |
| JP | 2015-173287 A | 10/2015 |
| WO | WO-2013/005646 A1 | 1/2013 |

* cited by examiner

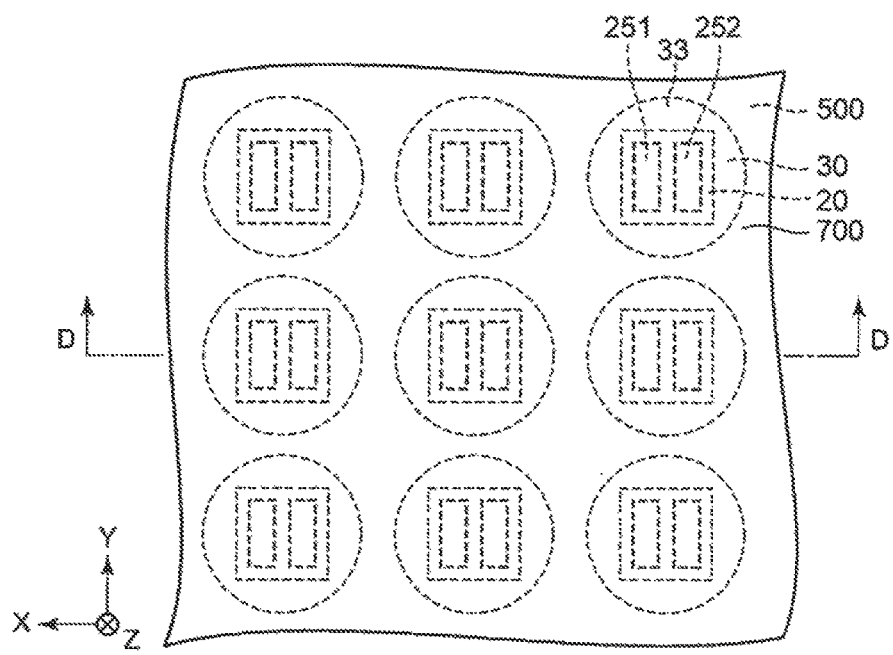
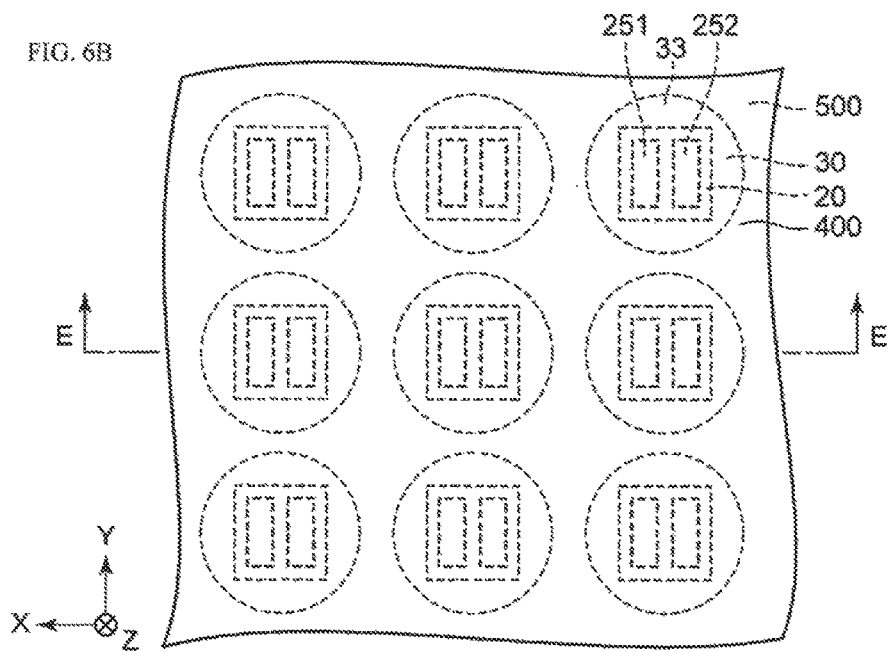

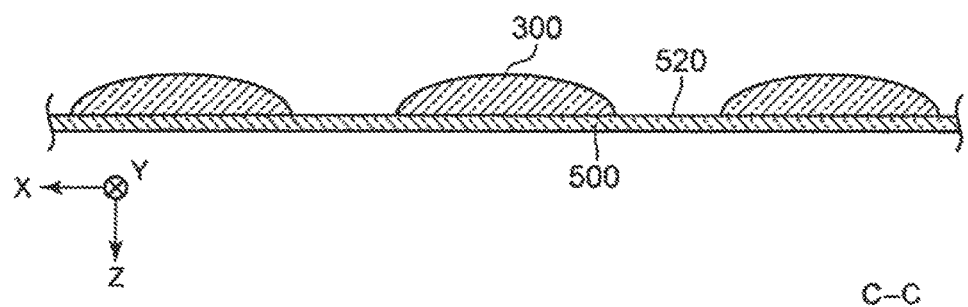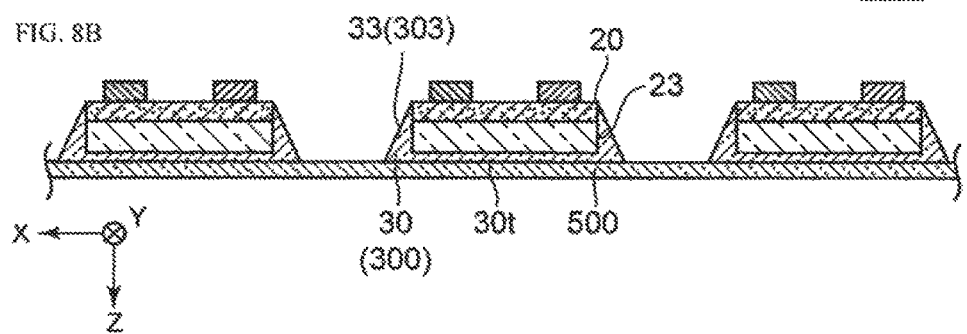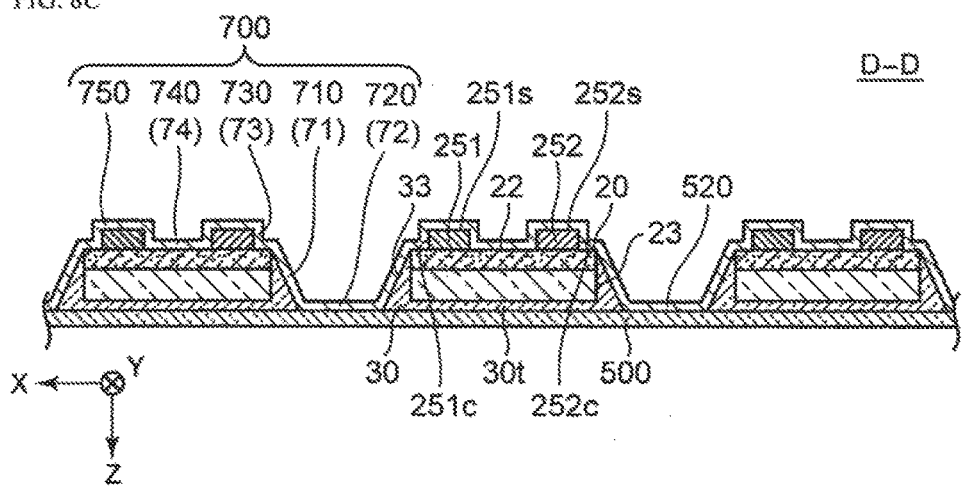

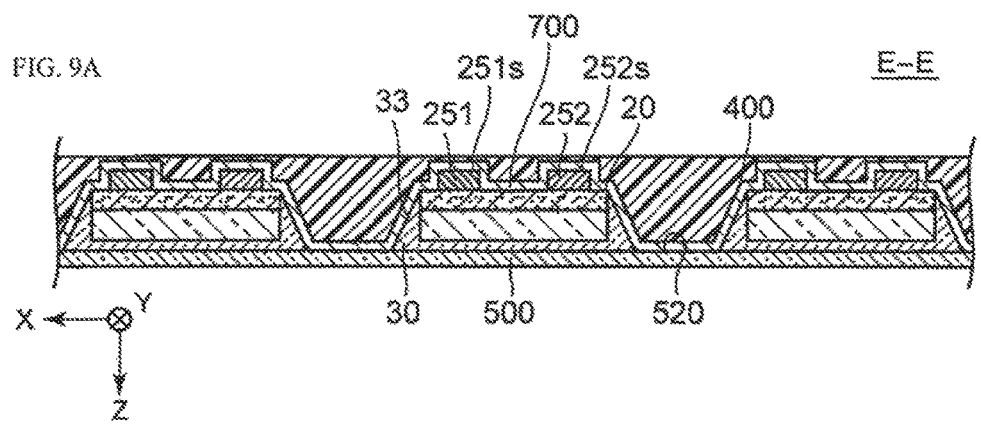
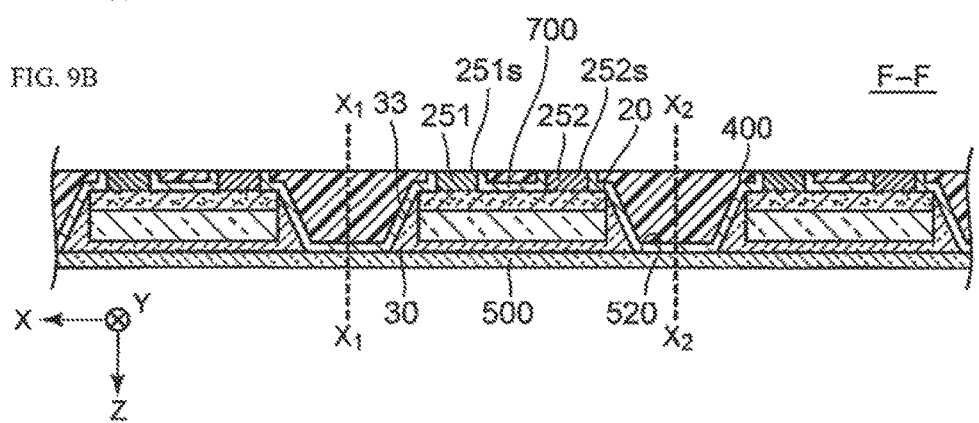
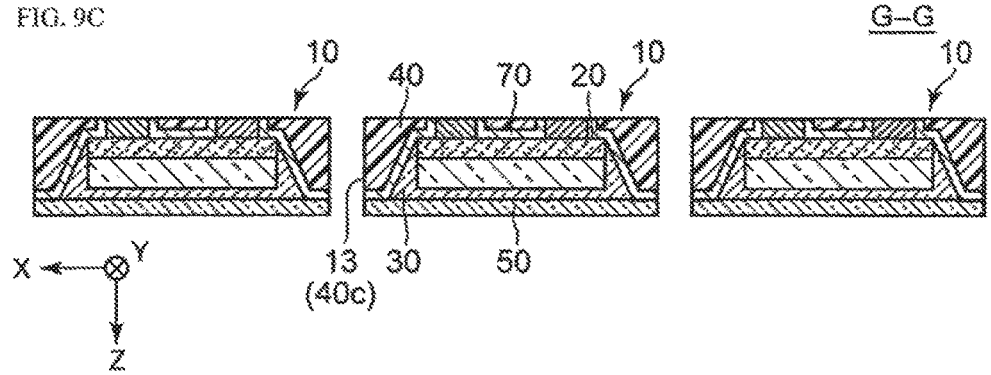

LIGHT EMITTING DEVICE AND METHOD FOR MANUFACTURING THE SAME

CROSS-REFERENCE TO RELATED APPLICATIONS

The present application claims priority under 35 U. S. C. § 119 to Japanese Patent Application No. 2015-106547, filed May 26, 2015. The contents of this application are incorporated herein by reference in their entirety.

BACKGROUND

This disclosure relates to light emitting devices and methods for manufacturing light emitting devices.

Light emitting devices in which lateral faces of a light emitting element are covered by a covering member formed of a light reflecting resin material, have been proposed (see, for example, Japanese Unexamined Patent Application Publication Nos. 2012-227470 ("JP '470") and 2013-012545 ("JP '545"), and International Patent Application Publication No. 2013/005646 ("WO '646"). In these light emitting devices, light extraction efficiency is increased by disposing a light transmissive member between the light emitting element and a covering member, and extracting the light exiting the lateral faces of the light emitting element from an emission face of the light emitting device through the light transmissive member. The covering member has a function of retaining the strength of the light emitting device in lieu of a housing, and a function of reflecting the light that reaches the covering member after passing through the light transmissive member.

Moreover, light emitting devices that emit light of a different color than that of the light emitting element by disposing a wavelength converting member on the emission face side that converts the wavelength of a portion of the light from the light emitting element have also been proposed (see, for example, JP '470, JP '545, and WO '646). When disposed to cover at least the light extraction faces of the light emitting element and the light transmissive member, the wavelength converting member can convert the wavelengths of both the light exiting the light emitting element towards the emission face and the light exiting the light emitting element through the light transmissive member towards the emission face. Furthermore, the light converting member can also be formed to cover at least a portion of the covering member (see, for example, JP '470, JP '545, and WO '646). A portion of the light entering the wavelength converting member is scattered, and the wavelength is converted, by the phosphor contained in the wavelength converting member, and a portion of the scattered light may propagate across the entire wavelength converting member while being reflected by the covering member. Thus, by increasing the area of the wavelength converting member, the emission face of the light emitting device can be expanded.

SUMMARY

A light emitting device according to one embodiment of the invention comprises: a light emitting element having a first face positioned on the emission face side of the light emitting device, a second face opposing the first face, and lateral faces positioned between the first face and the second face; a light transmissive member formed from a resin-containing material, covering at least a portion of the lateral faces of the light emitting element, and having a first face positioned on the emission face side; a covering member covering the exterior of the light transmissive member and having a first face positioned on the emission face side; a wavelength converting member covering the first face of the light emitting element, the first face of the light transmissive member, and the first face of the covering member; and a light reflective film comprising a first reflective film portion made of an inorganic material disposed between the exterior of the light transmissive member and the covering member, and a second reflective film portion made of an inorganic material disposed between the first face of the covering member and the wavelength converting member.

A method for producing the light emitting device according to one embodiment of the invention includes: a step of disposing a light emitting element on a wavelength converting member; a step of covering the lateral faces of the light emitting element with a light transmissive member, a step of covering the exterior of the light transmissive member with a first reflective film portion which is an inorganic material; a step of covering the portion of the wavelength converting member exposed from the light transmissive member with a second reflective film portion which is an inorganic material; and a step of covering the first reflective film portion and the second reflective film portion with a covering member.

BRIEF DESCRIPTION OF THE DRAWINGS

FIGS. 6A and 6B are schematic plan views explaining the first manufacturing method for the light emitting device according to Embodiment 1.

FIG. 8A is a schematic sectional view along lie B-B indicated in FIG. 5A.

FIG. 8B is a schematic sectional view along line C-C indicated in FIG. 5B.

FIG. 8C is a schematic sectional view along line D-D indicated in FIG. 6A.

FIG. 9A is a schematic sectional view along line E-E indicated in FIG. 6B.

FIG. 9B is a schematic sectional view along line F-F indicated in FIG. 7A.

FIG. 9C is a schematic sectional view along line G-G indicated in FIG. 7B.

DETAILED DESCRIPTION

Figure 1:
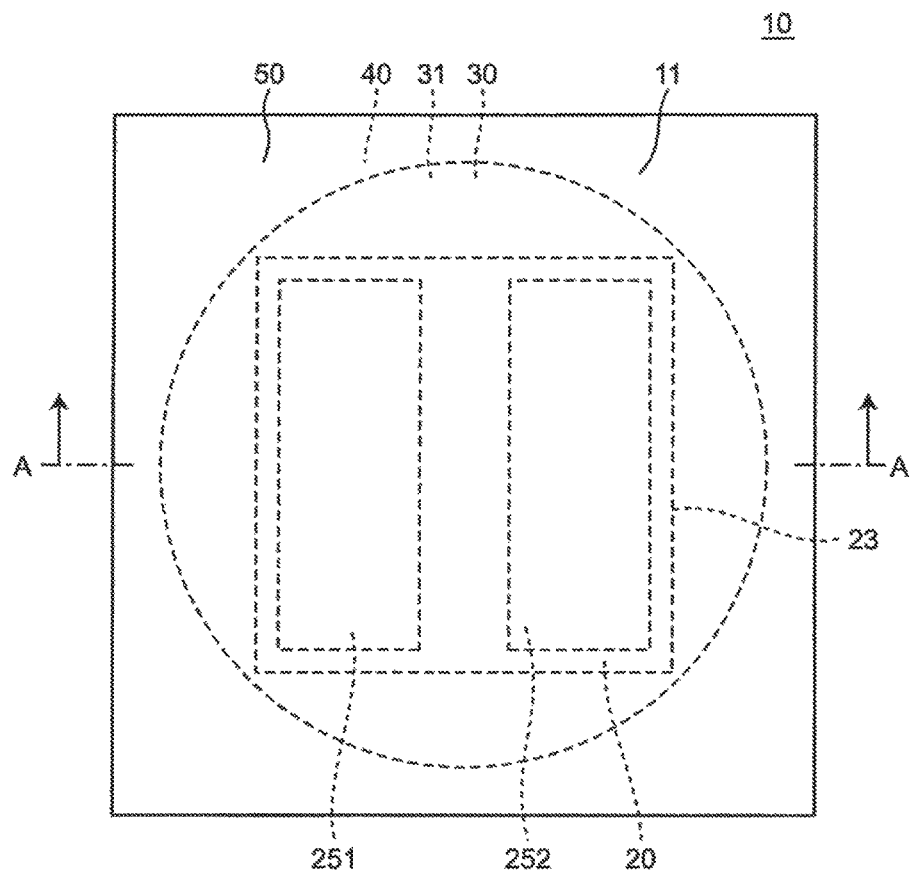
FIG. 1 is a schematic plan view of the light emitting device according to Embodiment 1.

Embodiments of the present invention will be explained in detail below based on drawings. In the explanations below, terms indicating certain directions and positions will be used as needed (for example, "upper," "lower," "right," "left," and other terms including these). These terms are used for the purpose of making the invention easily understood based on the drawings being referred to, and the technical scope of the invention should not be limited by the meanings of these terms. The portions denoted by the same reference numerals appearing in multiple drawings represent the same portions or components.

Embodiment 1

The light emitting device 10 according to the embodiment shown in FIGS. 1 and 2A includes a light emitting element 20, a light transmissive member 30 disposed on lateral faces 23 of the light emitting element 20, and a covering member 40 which covers exterior 33 of the light transmissive member 30. The light emitting device 10 can include a wavelength converting member 50 on the first face (upper face) 11 side which functions as the emission face. The wavelength converting member 50 covers a first face (upper face) 21 of the light emitting element 20, a first face (upper face) 31 of the light transmissive member 30, and a first face (upper face) 41 of the covering member 40. A light reflective film 70 is disposed between the covering member 40 and the light transmissive member 30, and between the covering member 40 and the wavelength converting member 50.

However, depending on the material used for, or the thickness of, the covering member, light might not be fully reflected by the covering member.

Accordingly, an object of certain embodiments of the present invention is to provide a light emitting device having good light extraction and a manufacturing method for the same.

According to certain embodiments of the invention, the covering member can be made thin while reducing a mechanical strength decline and a light leakage increase.

By including the light reflective film 70 between the covering member 40 and the light transmissive member 30, the light from the light emitting element 20 that passed through the light transmissive member 30 can be reflected before it reaches the covering member 40. By including the light reflective film 70 between the covering member 40 and the wavelength converting member 50, the light that propagated inside the wavelength converting member 50 can be reflected by the light reflecting member 70 before it reaches the covering member 40. Accordingly, the covering member 40 may be designed without considering any reduction in the optical reflectance of the covering member 40.

Figure 4:
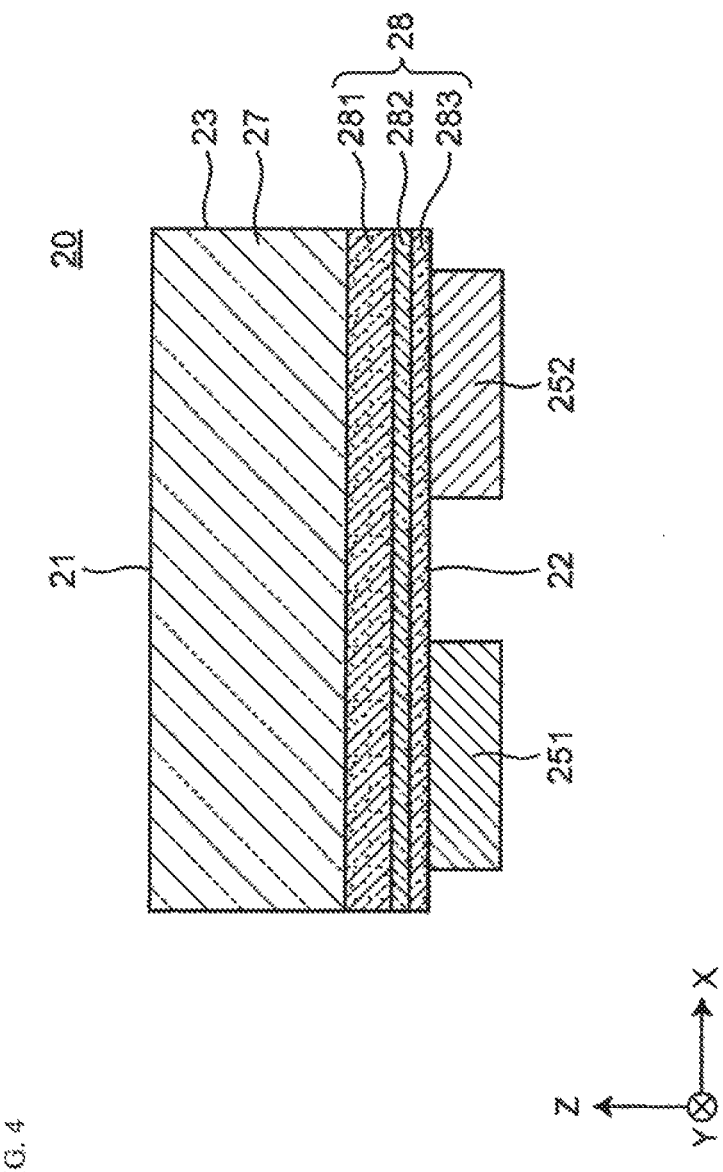
FIG. 4 is a schematic enlarged sectional view of the light emitting element shown in FIG. 2.

As shown in FIG. 4, the light emitting element 20 can include a light transmitting substrate 27 and a semiconductor stack 28 formed on a lower face side of the light transmitting substrate 27. The light emitting element 20 has a first face (upper face) 21 on the light transmitting substrate 27 side, a second face (lower face) 22 on the semiconductor stack 28 side opposing the first face 21, and a plurality of lateral faces 23 located between the first face 21 and the second face 22. The first face 21 is positioned on the emission face side of the light emitting device 10.

For the light transmitting substrate 27, a sapphire substrate, for example, can be utilized.

On the second face (lower face) 22 side of the light emitting element 20, a pair of electrodes 251 and 252 is disposed for supplying electrical current to the light emitting element 20. In this specification, the "second face 22" of the light emitting element 20 refers to the face of the light emitting element 20 in the state in which the electrodes 251 and 252 are excluded. Accordingly, in this embodiment, the second face 22 coincides with the lower face of the semiconductor stack 28.

Referring back to FIG. 2, the lateral faces 23 of the light emitting element 20 are covered by the light transmissive member 30. The light transmissive member 30 guides the light exiting the lateral faces 23 of the light emitting element 20 towards the emission face (first face) 11 of the light emitting device 10. By providing the light transmissive member 30 between the lateral faces 23 of the light emitting element 20 and the covering member 40, the light reaching the lateral faces 23 of the light emitting element 20 can be extracted into the light transmissive member 30. Disposing the light transmissive member 30 on the lateral faces 23 of the light emitting element 20 can reduce the loss of light, thereby increasing the light extraction efficiency of the light emitting device 10.

The exterior 33 of the light transmissive member 30 preferably is oblique outwardly from the second face 22 side to the first face 21 side of the light emitting element 20. In other words, in a cross section such as that shown in FIG. 2, the exterior 33 appearing on the left and right hand sides of the light transmissive member 30 preferably spreads apart towards the emission face (first face) 11 of the light emitting device 10. The light exiting the lateral faces 23 of the light emitting element 20 and propagating in the light transmissive member 30 reaches the oblique exterior 33. The light being reflected by the light reflective film 70 covering the exterior 33 at this point can be directed towards the first face 11 of the light emitting device 10. This can increase the light extraction efficiency of the light emitting device 10.

Figure 2:
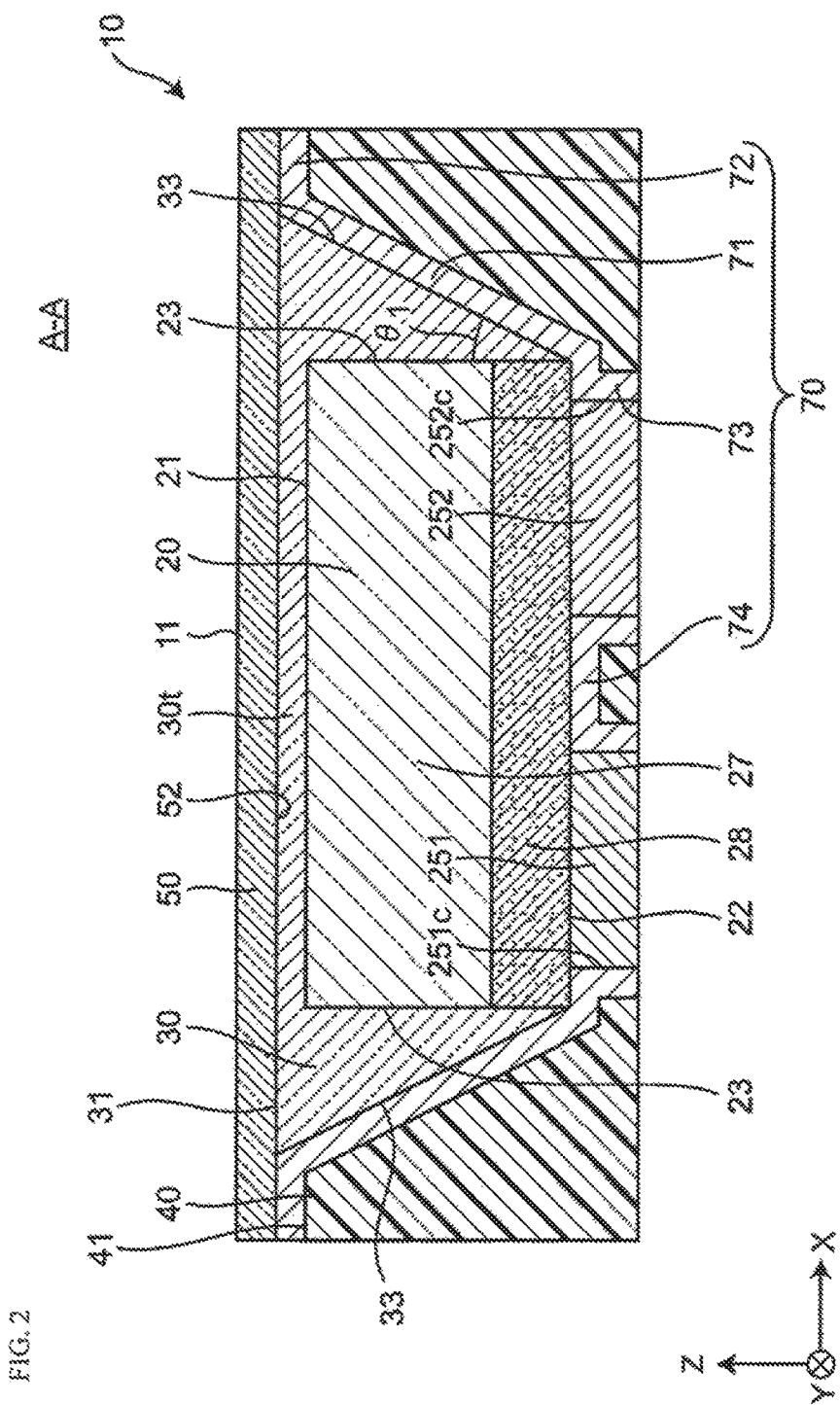
FIG. 2 is a schematic sectional view along line A-A indicated in FIG. 1.

In the sectional view of the light emitting element 20 shown in FIG. 2, the angle formed by the lateral face 23 and the exterior 33 of the light transmissive member 30 (denoted as the "tilt angle $\theta_1$") preferably is in a range between about 40° and about 60° and, for example, can be set to 45°. The outline shape in the plan view of the first face 31 of the light transmissive member 30 (drawn substantially circular in FIG. 1) is increased in size as the tilt angle $\theta_1$ is increased, thereby increasing the light extraction efficiency. On the other hand, the outline shape of the first face 31 can be reduced in size as the tilt angle $\theta_1$ is decreased, and thus the dimension of each side of the light emitting device 10 can be reduced in a top view (i.e., the light emitting device 10 can be made more compact). Considering both the light extraction efficiency and the compactness of the light emitting device 10, the tilt angle $\theta_1$ of 45° is preferable.

Figure 3:
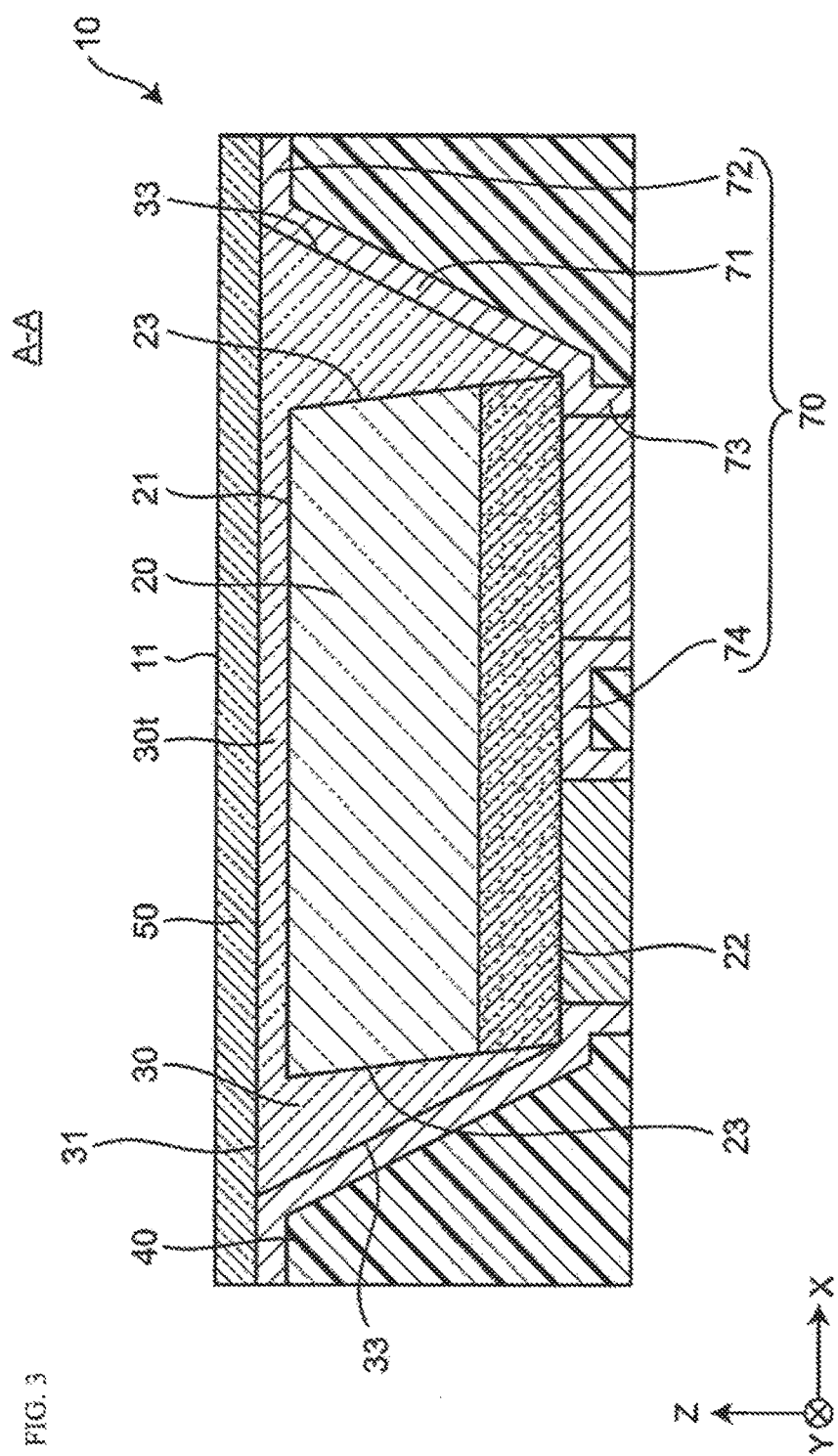
FIG. 3 is a schematic sectional view along line A-A indicated in FIG. 1 according to another embodiment.

When the lateral faces 23 of the light emitting element 20 are oblique relative to the second face 22, providing the light transmissive member 30 may be particularly effective. For example, in the cases where the light emitting elements 20 are separated by using cleavage the light transmitting substrate 27 (e.g., sapphire substrate) in the manufacturing method, the lateral faces 23 of the light emitting elements 20 might not always be perpendicular to the second face 22. For example, in a sectional view, the outer shape of the light emitting element 20 could be a substantially parallelogram as shown in FIG. 3 or a trapezoid. More particularly, the first face 21 and the second face 22 of the light emitting element 20 are in parallel, and two opposing lateral faces 23 are in parallel where each lateral face 23 is oblique relative to the first and second faces 21 and 22. In the cases where the lateral faces 23 of such a light emitting element 20 are directly covered by the covering member 40 without disposing the light transmissive member 30, since one of the lateral faces 23 forms an obtuse angle with the second face 22, the light reflected by the covering member 40 covering this lateral face 23 can travel towards the first face 21 to be extracted from the light emitting device 10 as is. However, since the other lateral face 23 forms an acute angle with the second face 22, the light reflected by the covering member 40 covering that lateral face 23 can travel towards the second face 22 to be attenuated inside the light emitting element 20 before being extracted from the light emitting element 20. By covering the latter lateral face 23 with the light transmissive member 30, the light reaching that lateral face 23 can be extracted from the first face 11 of the light emitting device 10 through the light transmissive member 30 instead of being reflected towards the second face 22.

In this embodiment, the semiconductor stack 28 includes at least three semiconductor layers: a first conductive type semiconductor layer 281, an emission layer 282, and a second conductive type semiconductor layer 283 as shown in FIG. 4. Referring to FIG. 2, the light emitted at the light emitting element 20 (more precisely the emission layer 282 of the semiconductor stack 28 shown in FIG. 4) travelling from the semiconductor stack 28 through the light transmitting substrate 27, or through the lateral faces 23 of the light emitting element 20 and the light transmissive member 30, is extracted at the first face 11 side of the light emitting device 10. The light transmissive member 30 covers at least a portion of the lateral faces 23 of the light emitting element 20.

In the cases where the light transmissive member 30 covers a portion of the lateral faces 23, the lateral faces of the first conductive type semiconductor layer 281 and the light emitting layer 282, among the three semiconductor layers 281, 282, and 283 exposed at the lateral faces of the semiconductor stack 28, are preferably completely covered by the light transmissive member 30.

As shown in FIG. 2, the light transmissive member 30 may further cover the entire first face 21 of the light emitting element 20. A layer shape light transmissive member 30t present on the first face 21 of the light emitting element 20 can protect the first face 21 of the light emitting element 20. The layer shape light transmissive member 30t, moreover, can also function as the adhesive member that adheres the first face 21 to the wavelength converting member 50.

As shown in FIG. 2, the covering member 40 covers the exterior 33 of the light transmissive member 30. Between the covering member 40 and the exterior 33 of the light transmissive member 30, the light reflective film 70 (first reflective film portion 71) discussed later is disposed. The covering member 40 may be formed from a material having a high reflectance (that is, light reflecting material), or a material having low reflectance, such as a material having a high light transmittance or absorption. The covering member 40 may further cover the lateral faces 251c and 252c of the electrodes 251 and 252 of the light emitting element 20, and the portion of the second face (lower face) 22 of the light emitting element 20 where the electrodes 251 and 252 are not disposed.

The wavelength converting member 50 disposed on the first face 11 side of the light emitting device 10 covers the first face (upper face) 21 of the light emitting element 20, the first face (upper face) 31 of the light transmissive member 30, and the first face (upper face) 41 of the covering member 40. These first faces (upper faces) 21, 31, and 41 are positioned on the emission face (first face 11) side of the light emitting device 10. Between the wavelength converting member 50 and the first face 41 of the covering member 40, the light reflective film 70 (more specifically second reflective film portion 72) discussed later is disposed.

The light emitting device 10 can have a light reflective film 70 for reflecting the light emitted at the light emitting element 20 and the light which has undergone wavelength conversion by the wavelength converting member 50 towards the emission surface (the first face 11 of the light emitting device 10). The light reflective film 70 can include a first reflective film portion 71, a second reflective film portion 72, a third reflective film portion 73, and a fourth reflective film portion 74. The first to fourth reflective film portions will be individually explained below.

First Reflective Film Portion 71

A first reflective film portion 71 is disposed between the exterior 33 of the light transmissive member 30 and the covering member 40. This allows for the light extracted from the lateral faces 23 of the light emitting element 20 into the light transmissive member 30 to be reflected by the first reflective film portion 71 and extracted from the first face (upper face) 11 of the light emitting device 10.

If no first reflective film portion 71 were disposed, the exterior 33 of the light transmissive member 30 would be covered by the covering member 40 directly. It is possible to have the covering member 40 covering the exterior 33 of the light transmissive member 30 reflect the light by using a high optical reflectance material (e.g., a white resin material) for the covering member 40. If the covering member 40 is thin walled, however, a portion of the light could pass through the covering member 40. For the additives for the covering member 40, moreover, those that reduce optical reflectance cannot be selected. For example, since carbon black is black colored and absorbs light, adding carbon black to the covering member 40 could reduce the light extraction efficiency of the light emitting device 10 as a portion of the light reaching the exterior 33 of the light transmissive member 30 can be absorbed by the covering member 40.

By providing the first reflective film portion 71 between the light transmissive member 30 and the covering member 40, however, the light which reaches the exterior 33 of the light transmissive member 30 can be substantially fully reflected by the first reflective film portion 71 without reaching the covering member 40. This can reduce a decline in the light extraction efficiency of the light emitting device 10 due to the low optical reflectance of the covering member 40. This, for example, allows for the addition of any additive, for example, additives such as carbon black in the covering member 40.

Second Reflective Film Portion 72

A second reflective film portion 72 is disposed between the first face 41 of the covering member 40 and the second face 52 of the wavelength converting member 50. The light traveling towards the first face 41 of the covering member 40 after undergoing wavelength conversion by the wavelength converting member 50 can be reflected by the second reflective film portion 72 to be extracted from the first face 11 of the light emitting device 10.

The light emitted at the light emitting element 20 travels from the upper face 21 of the light emitting element 20 through the layer shape light transmissive member 30t, or from the upper face 31 of the light transmissive member 30, and enters the wavelength converting member 50. The wavelength converting member 50 contains a wavelength converting material, such as a phosphor, and the wavelength of the light is convened when irradiated to the wavelength converting material. The wavelength converted light may be scattered by the wavelength converting material, a portion of which will travel towards the second face (lower face) 52 of the wavelength converting member 50.

If no second reflective film portion 72 were disposed, a portion of the scattered light would travel towards the first face (upper face) 41 of the covering member 40 which is in contact with the second face 52 of the wavelength converting material 50. It is possible to have the first face 41 of the covering member 40 covering the exterior 33 of the light transmissive member 30 reflect the light by using a high optical reflectance material (e.g., a white resin material) for the covering member 40. However, adding an additive that may reduce optical reflectance, such as carbon black, to the covering member 40 would reduce the light extraction efficiency of the light emitting device 10 because a portion of the light reaching the exterior 33 of the light transmissive member 30 may be absorbed by the covering member 40.

By providing the second reflective film portion 72 between the wavelength converting member 50 and the covering member 40, the light which reaches the exterior 33 of the light transmissive member 30 can be substantially fully reflected by the second reflective film portion 72 without reaching the covering member 40. This can reduce a decline in the light extraction efficiency of the light emitting device 10 due to the low optical reflectance of the covering member 40, and enables the addition of any additives, for example, such as carbon black.

Third Reflective Film Portion 73 and Fourth Reflective Film Portion 74

A third reflective film portion 73 may be disposed between the covering member 40 and the lateral faces 251c and 252c of the electrodes 251 and 252. Furthermore, a fourth reflective film portion 74 may be disposed between the covering member 40 and the region of the second face 22 of the light emitting element 20 where the electrodes 251 and 252 are not formed (referred to as the "exposed region"). The light generated at the light emitting layer 282 of the light emitting element 20 as shown FIG. 4 and traveling towards the second face (lower face) 22 of the light emitting element 20 can be reflected by the third reflective film portion 73 to be extracted from the light emitting element 20 from the lateral faces 23 or the first face (upper face) 21 of the light emitting element 20.

If no third reflective film portion 73 were disposed, the exposed region of the second face 22 of the light emitting element 20 would be covered by the covering member 40. It is possible to have the second face 22 of the light emitting element 20 reflect the light traveling towards the exposed region by using a high optical reflectance material (e.g., a white resin material) for the covering member 40. However, adding an additive that may reduce optical reflectance, such as carbon black, to the covering member 40 would reduce the light extraction efficiency of the light emitting device 10 because a portion of the light reaching the exposed region of the light emitting element 20 may be absorbed by the covering member 40.

By providing the fourth reflective film portion 74 between the exposed region of the light emitting element 20 and the covering member 40, the light reaching the exposed region of the light emitting element 20 can by substantially fully reflected by the fourth reflective film portion 74 without reaching the covering member 40. This can reduce a decline in the light extraction efficiency of the light emitting device 10 due to the low optical reflectance of the covering member 40, and enables the addition of any additives such as carbon black.

Since the light traveling towards the electrodes 251 and 252 disposed at the lower face 22 of the light emitting element 20 is reflected by the electrodes 251 and 252, there may be little light that reaches the lateral faces 251c and 252c of the electrodes 251 and 252. However, disposing the third reflective film portion 73 can reduce a gap may be formed between the second reflective film portion 72 and the lateral faces 251c and 252c of the electrodes 251 and 252, thereby increasing the light extraction efficiency of the light emitting device 10.

As described above, the first reflective film portion 71, the third reflective film portion 73, and the fourth reflective film portion 74 contribute to reflecting the light generated at the light emitting layer 282 of the light emitting element 20 shown in FIG. 4. The second reflective film portion 72, on the other hand, primarily contributes to reflecting the light which has undergone wavelength conversion by the wavelength converting member 50. As such, the wavelength of the light to be reflected by the reflective film may differ depending on the location of the light reflective film 70.

In addition, the first reflective film portion 71 preferably has high adhesion properties with the light transmissive member 30, the second reflective film portion 72 preferably has high adhesion properties with the wavelength converting member 50, the third reflective film portion 73 preferably has high adhesion properties with the electrodes 251 and 252, and the fourth reflective film portion 74 preferably has high adhesion properties with the semiconductor stack 28. As such, the subject with which the adhesion properties of the light reflective film 70 should be increased may differ depending on the location of the light reflective film 70.

Accordingly, the first to fourth reflective film portions 71 to 74 of the light reflective film 70 can be each formed from a respectively preferable material. However, forming each reflective film using a different material requires individually established production steps for the reflective films, which could complicate the production method as well as increasing the production costs for the light emitting device 10.

In order to reduce the production costs, it is preferable to form at least two of the first to fourth reflective film portions 71 to 74 with the same material. This can simplify the production method. For example, the first reflective film portion 71 and the second reflective film portion 72 can be formed with the same material. This can simplify the production method because both the first reflective film portion 71 and the second reflective film portion 72 can be formed in one step. This may reduce the creation of a gap between the first reflective film portion 71 and the second reflective film portion 72 because the first reflective film portion 71 and the second reflective film portion 72 are formed from a continuous film.

The light reflective film 70 can be formed from an inorganic material, for example, a dielectric multilayer film, a metal film, or the like. A portion of the light reflective film 70 may be formed with a dielectric multilayer film while forming another portion from a metal film, or the entire light reflective film 70 may be formed from either a dielectric multilayer film or a metal film.

A dielectric multilayer film, which is formed with multiple layers of an insulating material, provides an advantage of not causing a short circuit even when formed directly on the surfaces of the electrodes 251, 252, and the semiconductor stack 28. Accordingly, it is preferable to form the third reflective layer 73, which can come into contact with the electrodes 251 and 252, and the fourth reflective film portion, which can come into contact with the electrodes 251, 252, and the semiconductor stack 28, from a dielectric multilayer film.

Since a dielectric multilayer film is designed to reflect light having a specific wavelength, the wavelength range of the light it can reflect may be narrow. Given that the third reflective film portion 73 and the fourth reflective film portion 74 primarily contribute to reflecting the light emitted from the light emitting element 20 (that is, the light having a specific and narrow wavelength range), they can highly efficiently reflect the light even if they are made from a dielectric multilayer film having a narrow reflectable wavelength range.

A metal film has high reflectance over a relatively broad wavelength range. Accordingly, a metal film is suitably formed in the portions where a short circuit is not a concern, and the light of varying wavelengths can be present. It is preferable to form the first reflective film portion 71 and the second reflective film portion 72 from a metal film because they do not come into contact with the electrodes 251, 252, or the semiconductor stack 28. It is particularly preferable to form the second reflective film portion 72, which needs to reflect the mixture of the light emitted from the light emitting element 20 and the light that has undergone wavelength conversion by the wavelength converting member 50, from a metal film having a broad reflectable wavelength range (e.g., a metal film made of an Ag or Ag alloy).

The third reflective film portion 73 and the fourth reflective film portion 74 can also be formed from a metal film. In this case, it is preferable to cover the lateral faces 251c and 252c of the electrodes 251 and 252, as well as the exposed region of the second face 22 of the light emitting element 20, with a light transmissive insulating film (e.g., silicon oxide), and then form the third reflective film portion 73 and the fourth reflective film portion 74 made of a metal film on the insulating film.

Furthermore, the first to fourth reflective film portions 71 to 74 may be of a multilayer reflective film in which a dielectric multilayer film and a metal film are stacked. More specifically, a dielectric multilayer film is disposed on the light emitting element 20 side, and a metal film is disposed on the covering member 40 side. Since a dielectric multilayer film is disposed between a metal film and the semiconductor stack 28, the electrodes 251 and 252 of the light emitting element 20, occurrences of short circuits between the metal film and the semiconductor stack 28, the electrodes 251, and 252 can be prevented. In the case of a mixture of light that includes the light emitted from the light emitting element 20 and the light that has undergone wavelength conversion by the wavelength converting member 50, a portion of the light can pass through the multilayer reflective film. The light that has been transmitted through the dielectric multilayer film can be reflected by the metal layer that covers the dielectric multilayer film, and thus can be reduced the light reaching the covering member 40.

First Manufacturing Method

A first manufacturing method for the light emitting device 10 according to this embodiment will be explained with reference to FIGS. 5 to 9. In the first manufacturing method, plural light emitting devices 10 can be simultaneously produced.

Step 1-1. Disposition of Light Transmissive Member 30

Figure 5A:
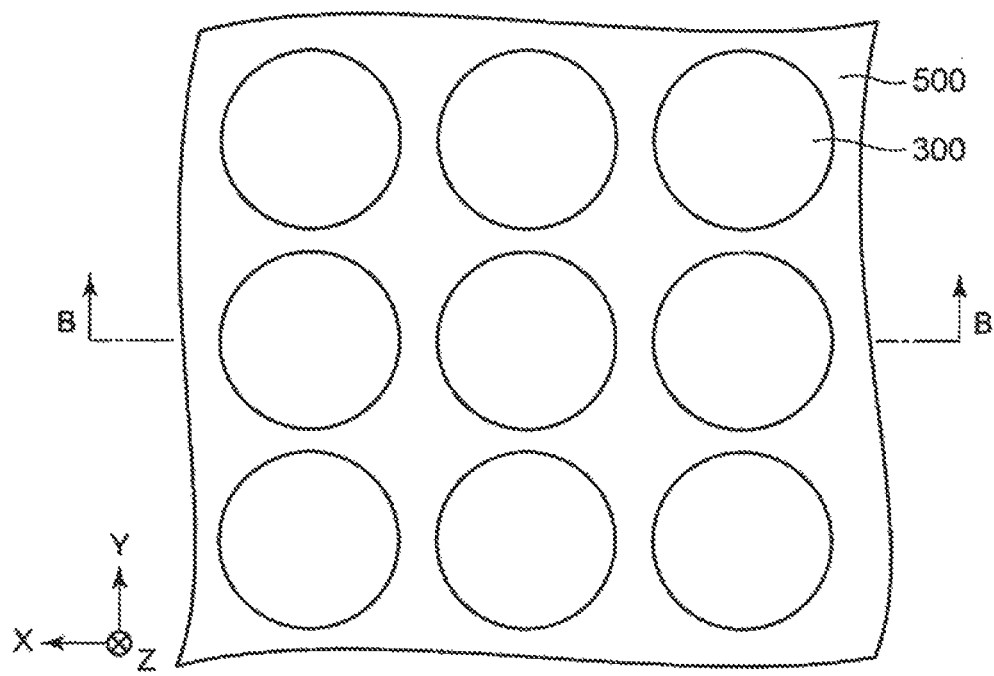
FIGS. 5A and 5B are schematic plan views explaining a first manufacturing method for the light emitting device according to Embodiment 1.

A liquid resin material 300 for forming the light transmissive members 30 is applied to the second face 520 of the wavelength converting sheet 500 in spaced apart islands like shape as shown in FIGS. 5A and 8A. At this time, using a relatively large wavelength converting sheet 500, the liquid resin material 300 is disposed in a plurality of islands. Each island of the liquid resin material 300 can have any shape in a plan view, and examples include a circle, oval, square, and rectangle. In the case where the spacing between adjacent islands of the liquid resin material 300 is too wide, the number of light emitting devices 10 that can be produced at one time may decrease, and mass production efficiency for the light emitting devices 10 may be reduced. It is thus preferable to dispose the liquid resin material 300 at appropriate intervals.

Step 1-2. Securing of Light Emitting Elements 20 and Curing of Liquid Resin Material 300

Figure 5B:
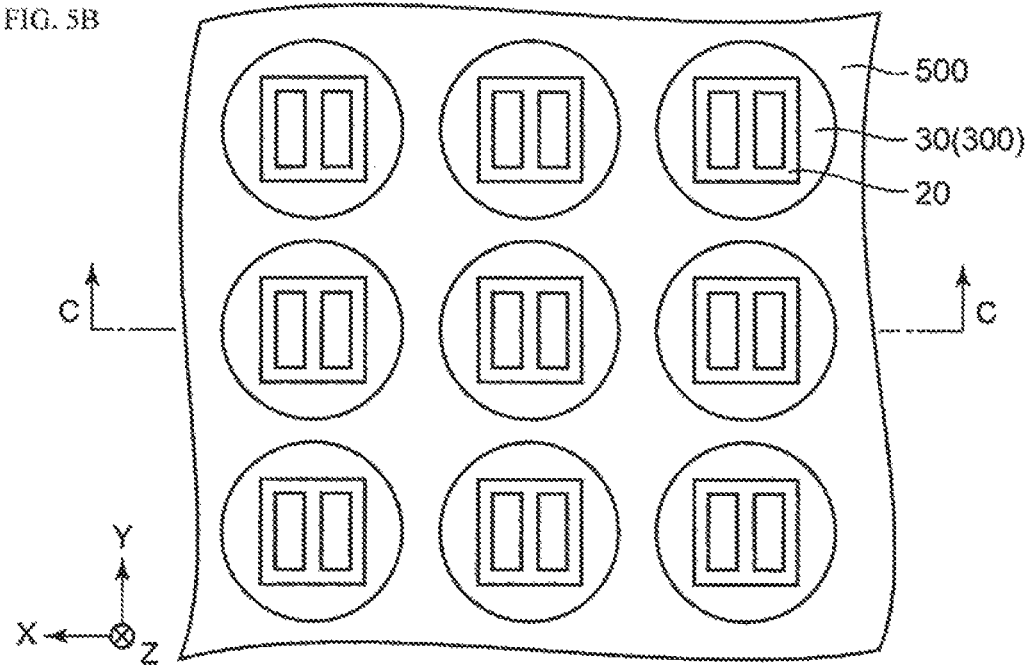

As shown in FIGS. 5B and 8B, light emitting elements 20 are placed on the islands of the liquid resin material 300. At this point, the light emitting elements 20 are placed so that their first faces 21 oppose the second face 520 of the wavelength converting sheet 500. Simply placing the light emitting elements 20 on the islands of the liquid resin material 300, or pressing them down thereafter, allows the liquid resin material 300 to creep up the lateral faces 23 of each light emitting element 20 due to surface tension, giving the exterior 303 of the liquid resin material 300, which will later become the exteriors 33 of the light transmissive members 30, a downwardly spread shape. The liquid resin material 300 is subsequently cured by heating or the like, to form the light transmissive members 30.

The shape of the liquid resin material 300 in a plan view will be deformed as the light emitting elements 20 are placed or pressed down thereon to each acquire the shape that is substantially consistent with the outline of the first face 31 of the light transmissive member 30 of the light emitting device 10, the finished product as shown in FIGS. 1 and 2.

In this manufacturing method, a portion of the liquid resin material 300 is present between the wavelength converting sheet 500 and the light emitting elements 20 in the form of a film. The layer shape light transmissive member 30t obtained by curing the liquid resin material 300 can also function as an adhesive between the wavelength converting sheet 500 and the light emitting elements 20. The thickness of the layer shape light transmissive member 30t is preferably determined by taking into consideration adhesion and the heat dissipation of the light emitting devices 10. More specifically, the thickness of the layer shape light transmissive member 30t can be set, for example, in a range between about 2 and about 30 µm, preferably in a range between 4 and 20 µm, most preferably in a range between about 5 and about 10 µm, so as to efficiently conduct the generated heat in the wavelength converting member 50 towards a mounting substrate via the light emitting element 20 when the light emitting device 10 shown in FIGS. 1 and 2 is emitting light.

Step 1-3. Formation of Continuous Light Reflective Film 700

As shown in FIGS. 6A and 8C, the light emitting elements 20, the light transmissive members 30, and the wavelength converting sheet 500 are covered with a continuous light reflective film 700. The continuous light reflective film 700 will become the light reflective film 70 after separating the light emitting devices 10 as shown in FIGS. 1 and 2. The continuous light reflective film 700 includes a first portion 710 covering the exterior 33 of the light transmissive member 30 (i.e., the first reflective film portion 71 when separated) and a second portion 720 covering the wavelength converting sheet 500 exposed from the light transmissive member 30 (i.e., the second reflective film portion 72 when separated). The continuous light reflective film 700 can further include a third portion 730 covering the lateral faces 251c and 252c of the electrodes 251 and 252 (the third reflective film portion 73 when separated) and a fourth portion 740 covering the exposed region of the second face 22 of the light emitting element 20 (the fourth reflective film portion 74 when separated). Furthermore, it can include a fifth portion 750 covering the surfaces 251s and 252s of the electrodes 251 and 252.

The first to fourth portions 710 to 740 making up the continuous light reflective film 700 can be formed by a film forming method, such as sputtering, CVD, coating, spraying, or the like. The first to fourth portions 710 to 740 can be individually formed, but are preferably formed simultaneously.

In the cases where the continuous light reflective film 700 is formed from a metal material, the electrodes 251, 252, and the semiconductor stack 28 are insulated from the continuous light reflective film 700 by forming an insulating film on the surfaces of the electrodes 251, 252, and the second face 22 of the light emitting element 20 where the semiconductor stack 28 is exposed. Alternatively, occurrences of short circuits between the continuous light reflective film 700 and the electrodes 251, 252, or the semiconductor stack 28 may be prevented by removing the third and fourth portions 730 and 740 of the continuous light reflective film 700 which are the portions covering the electrodes 251, 252, and the second face 22 of the light emitting element 20.

When two or more reflective films selected from among the group of the first reflective film portion, the second reflective film portion, the third reflective film portion, and the fourth reflective film portion are made of a same material, the reflective films made of the same material can be formed simultaneously. For example, when the first reflective film portion and the second reflective film portion are made from a metal film, while the third reflective film portion and the fourth reflective film portion are made from a dielectric multilayer film or a layer of insulating fine particles, the first reflective film portion and the second reflective film portion can be produced in one step, and the third reflective film portion and the fourth reflective film portion can be produced in another step.

Step 1-4. Formation of Covering Member 400

The continuous light reflective film 700 covering the exterior 33 of the light transmissive members 30 and the second face 520 of the wavelength converting sheet 500 (that is, the first portion 710 and the second portion 720) is covered with a covering member 400 as shown in FIGS. 6B and 9A. The covering member 400 will become the covering members 40 after separating the light emitting devices 10. Moreover, it is preferable to also cover the continuous light reflective film 700 covering the exposed regions of the second faces 22 of the light emitting elements 20 and the lateral faces 251c and 252c of the electrodes 251 and 252 (that is, the third portion 730 and the fourth portion 740) with the covering member 400. The thickness of the covering member 400 (dimension in −z direction) may be adjusted so that the continuous light reflective film 700 covering the surfaces 251s and 252s of the electrodes 251 and 252 of the light emitting element 20 (that is, the fifth portion 750) is also covered with the covering member 400. As shown in FIG. 9A, the plurality of light transmissive members 30 provided in the surrounding of the plurality of light emitting elements 20 disposed on the wavelength converting sheet 500 are thus covered by a single continuous covering member 400.

Figure 7A:
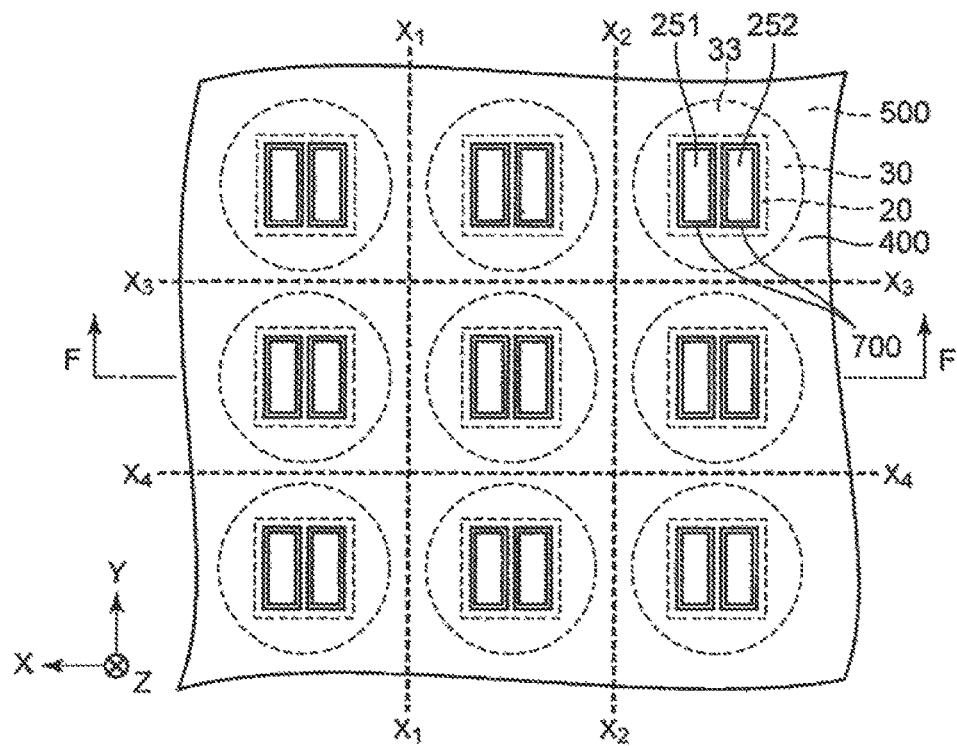
FIGS. 7A and 7B are schematic plan views explaining the first manufacturing method for the light emitting device according to Embodiment 1.
Figure 7B:
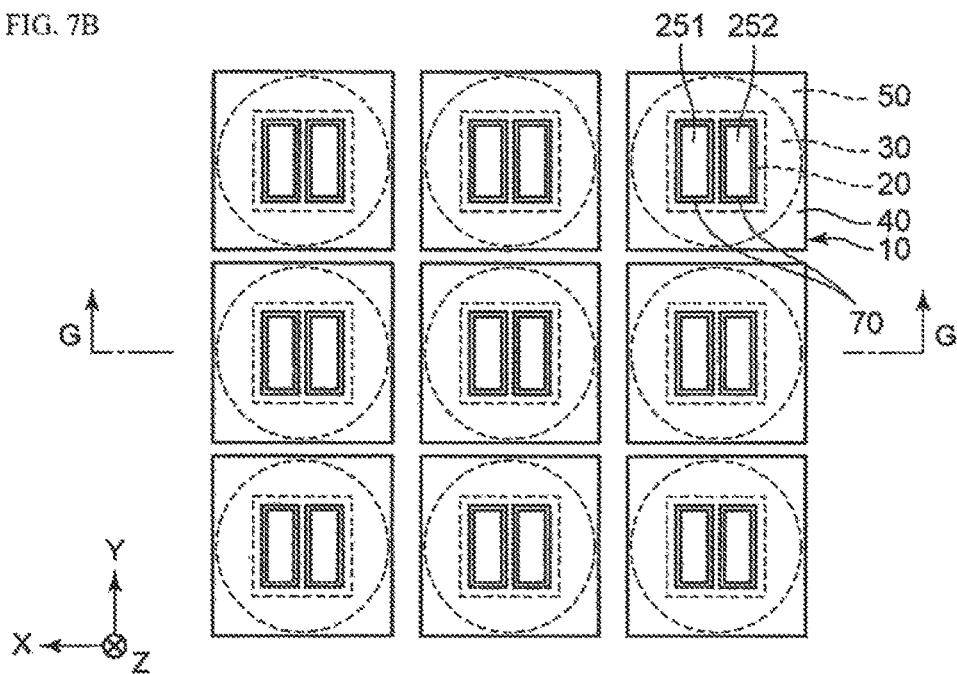

Subsequently, the covering member 400 and the fifth portion 750 of the continuous light reflective film 700 are removed by a known method so as to expose the electrodes 251 and 252 of the light emitting elements 20 (FIGS. 7A and 9B).

Step 1-5. Separation of Light Emitting Devices 10

The covering member 400, the continuous light reflective film 700, and the wavelength converting sheet 500 are cut along broken lines $X_1$, $X_2$, $X_3$, and $X_4$ running through the center of adjacent light emitting elements 20 (FIGS. 7A and 9B) using a dicer or the like. This separates the light emitting devices 10 into individual pieces (FIGS. 78 and 9C). In this way, plural light emitting devices 10 each having a light emitting element 20 can be simultaneously produced.

In the case where the light transmissive member 30 is exposed at any lateral face 13 of a individual light emitting device 10 (i.e., lateral face 40c of the covering member 40 shown in FIG. 9C), the emitted light from the light emitting element 20 may leak transversely from the lateral face 13 of the light emitting device 10 through the light transmissive member 30. Accordingly, it is preferable to adjust the intervals between adjacent light emitting elements 20 and the viscosity of the light transmissive members 30 so as not to expose the light transmissive members 30 at any lateral face 13 of the light emitting devices 10.

According to this manufacturing method, by placing the light emitting elements 20 on the islands of the liquid resin material 300 disposed on the wavelength converting sheet 500, the adhesion of the light emitting elements 20 and the formation of the light transmissive members 30 can simultaneously be performed. This can increase the mass production efficiency.

Second Production Method

A second production method for the light emitting device 10 according to this embodiment will be explained with reference to FIGS. 10 to 11. This differs from the first production method such that the light emitting elements 20 are secured on the wavelength converting sheet 500 before applying the liquid resin material 300. It is otherwise similar to the first production method. Explanations will be omitted for the steps that are similar to those in the first production method.

Step 2-1. Securing of Light Emitting Elements 20

Figure 10A:
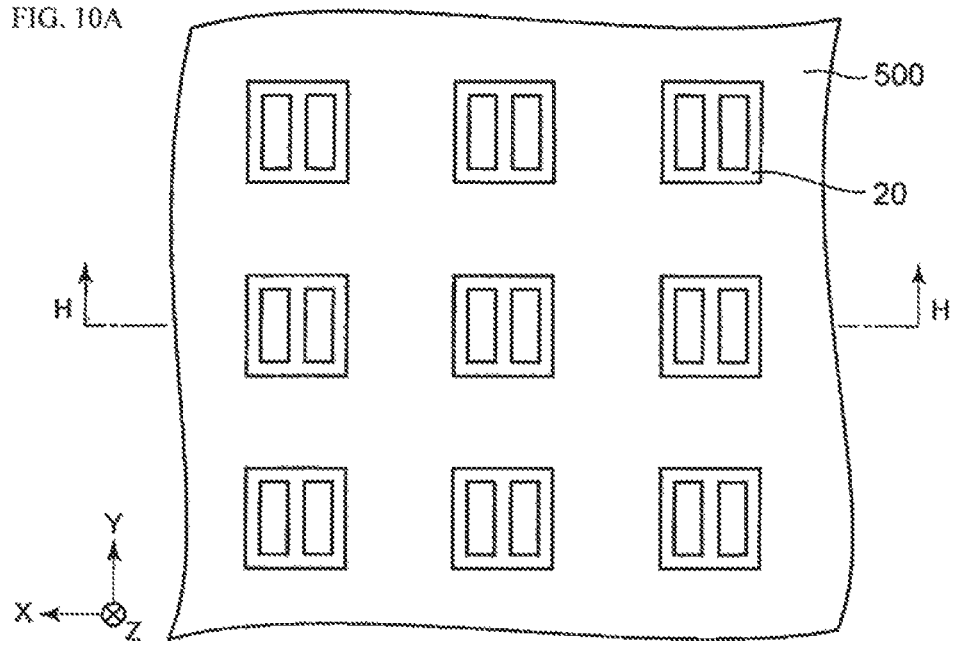
FIGS. 10A and 10B are schematic plan views explaining a second manufacturing method for the light emitting device according to Embodiment 1.
Figure 11A:
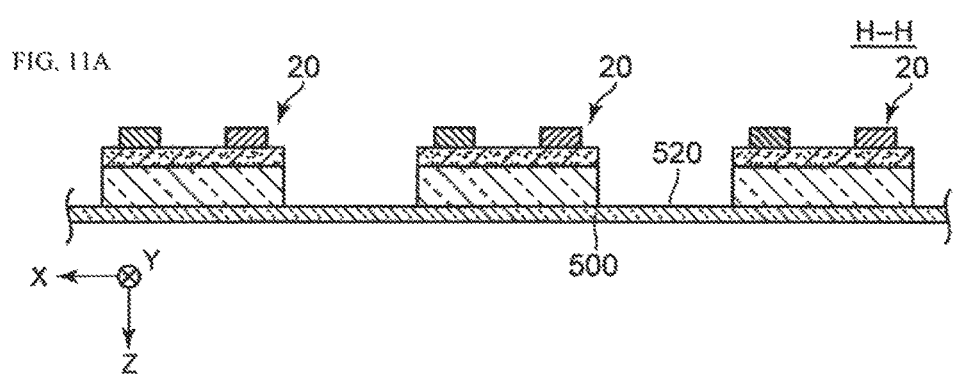
FIG. 11A is a schematic sectional view along line H-H indicated in FIG. 10A.

Light emitting elements 20 are placed on the second face 520 of the wavelength converting sheet 500 as shown in FIGS. 10A and 11A. At this time, the light emitting elements 20 are placed so that their first faces 21 oppose the second face 52 of the wavelength converting member 50. The wavelength converting sheet 500 will become wavelength converting members 50 after separating into the light emitting devices 10. Using a relatively large wavelength converting sheet 500, plural light emitting elements 20 are placed on the single wavelength converting sheet 500. The light emitting elements 20 are arranged at prescribed intervals. If the spacing between adjacent light emitting elements 20 were too wide, the number of light emitting devices 10 that may be produced at one time would decrease, and mass production efficiency for the light emitting devices 10 may be reduced. It is thus preferable to place the light emitting elements 20 at appropriate intervals.

The light emitting elements 20 can be secured on the wavelength converting member 50 using a light transmissive adhesive or the like. In the cases where the wavelength converting member 50 itself has adhesive properties for example, in semi-cured state or the like, the light emitting elements may be secured without using any adhesive.

Step 2-2. Formation of Light Transmissive Member 30

Figure 10B:
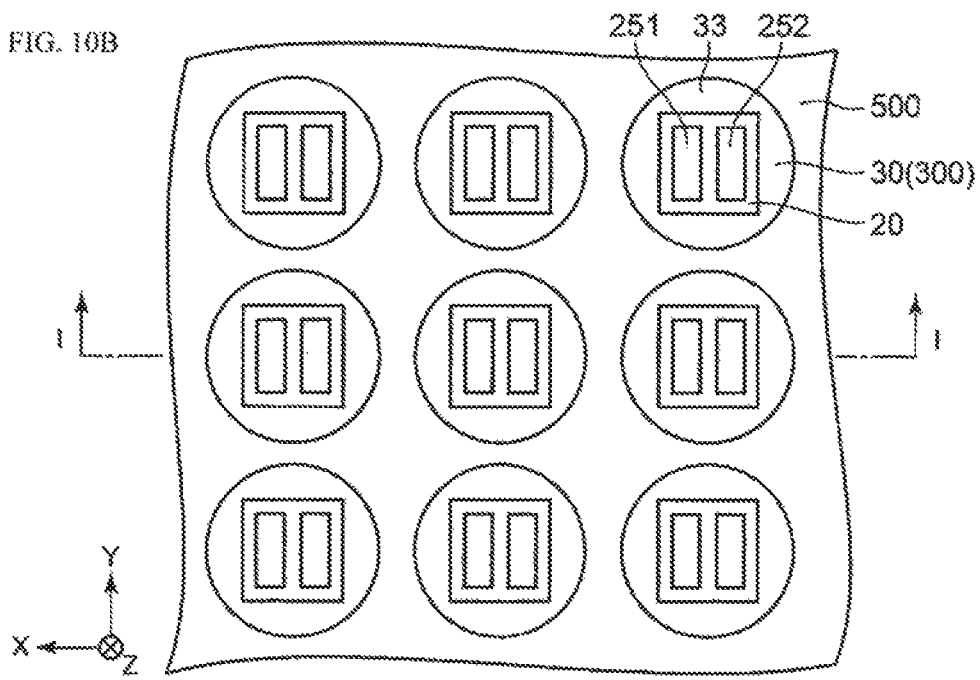
Figure 11B:
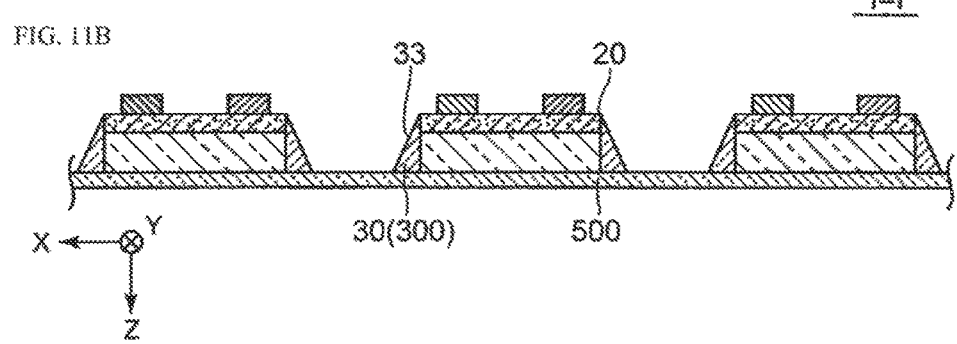
FIG. 11B is a schematic sectional view along line 1-1 indicated in FIG. 10B.

A light transmissive member 30 is formed so as to cover portions of the lateral faces 23 of the light emitting element 20 and the region of the second face 52 of the wavelength converting member 50 in the vicinity of each light emitting element 20 as shown in FIGS. 10B and 11B. A liquid resin material 30L, which is the raw material for the light transmissive member 30, is applied along the borders between the light emitting elements 20 and the wavelength converting member 50 using a dispenser, or the like. The light transmissive material 30L is formed so that the light transmissive material 30L formed in the periphery of one light emitting element 20 does not come into contact with the light transmissive material 30L formed in the periphery of any adjacent light emitting element 20. The liquid resin material 30L spreads on the wavelength converting member 50, as well as creeping up the lateral faces 23 of the light emitting elements 20 due to surface tension. Subsequently, the liquid resin material 30L is cured by heating or the like to obtain the light transmissive members 30.

Subsequently, the light reflective film 70 is formed in similar manner to in Step 1-3, the covering member 400 is formed in similar manner to in Step 1-4, and the light emitting devices 10 are separated in similar manner to in Step 1-5 of the first production method. In this way, plural light emitting devices 10 each having a light emitting element 20 can be simultaneously produced.

According to this production method, no layer shape light transmissive member 30t as shown in FIG. 2 is formed between the light emitting element 20 and the wavelength converting member 50. Thus, the second production method is suitable when it is preferable to directly bring the light emitting element into contact with the wavelength converting member 50, or interpose another member different from the light transmissive member 30 therebetween.

Embodiment 2

Figure 12:
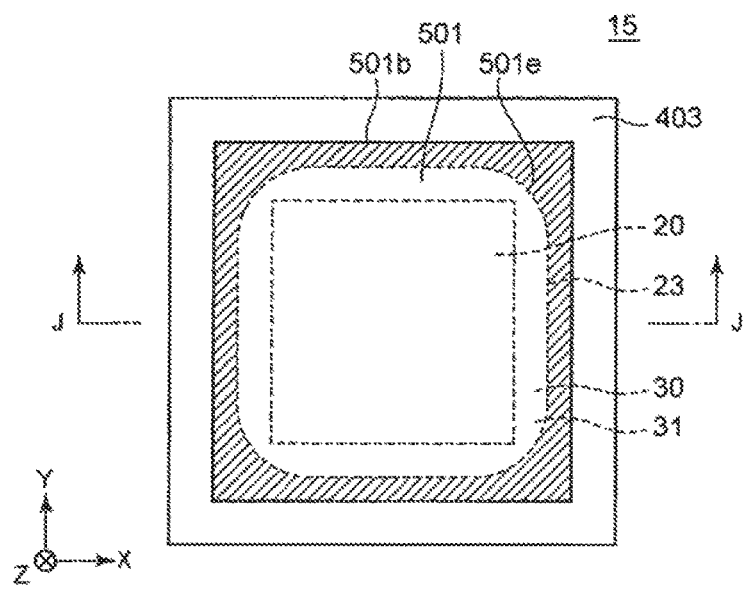
FIG. 12 is a schematic plan view of the light emitting device according to Embodiment 2.
Figure 13:
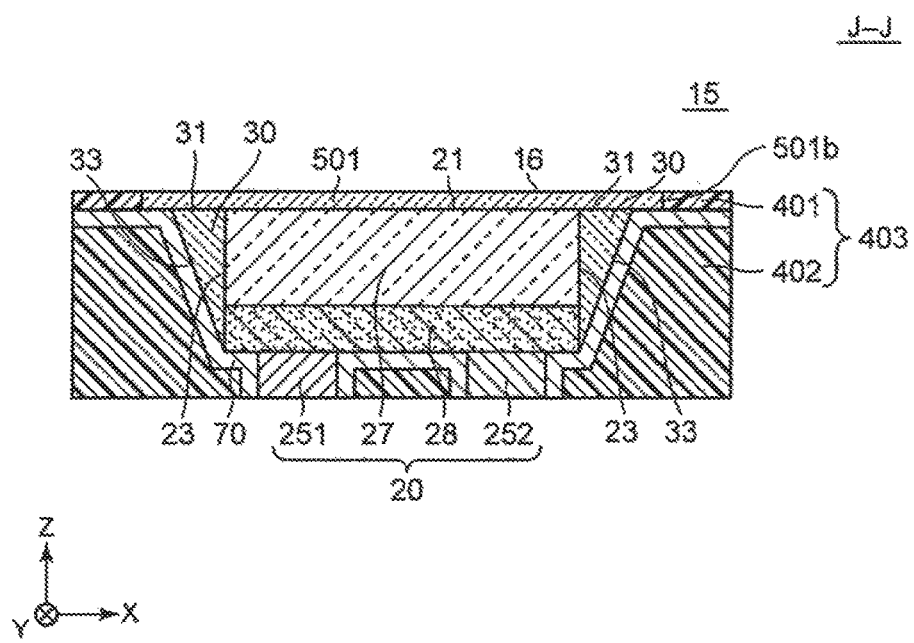
FIG. 13 is a schematic sectional view along line J-J indicated in FIG. 12.

As shown in FIGS. 12 and 13, the light emitting device 15 according to this embodiment differs from the light emitting device 10 according to Embodiment 1 such that lateral faces 501b of the wavelength converting member 501 are covered by the covering member 403, and the covering member 403 is of a double-layer structure. It is otherwise similar to Embodiment 1.

The light emitting device 15 according to this embodiment includes a light emitting element 20, a wavelength converting member 501 covering the first face 21 of the light emitting element 20, a light transmissive member 30 disposed on the lateral faces 23 of the light emitting element 20, and a covering member 403 covering the exterior 33 of the light transmissive member 30. In this embodiment, the covering member 403 includes a first covering member 401 that covers the lateral faces 501b of the wavelength converting member 501 and a second covering member 402 that covers the exterior 33 of the light transmissive member 30.

Covering the lateral faces 501b of the wavelength converting member 501 with the covering member 403 (i.e., the first covering member 401) can reduce the light emitted from the light emitting element 20 from propagating inside the wavelength converting member 501 and transversely leaking from the lateral faces 501b. Most portion of the light emitted from the light emitting device 15 can be extracted from the first face (upper face) 16 which functions as the emission face of the light emitting device 15. Since the light from the light emitting device 15 is substantially ejected in z direction, the light directionality of the light emitting device 15 can be enhanced.

In this embodiment, as in the case of the Embodiment 1, the light reflective film 70 is disposed between the covering member 40 and the exterior 33 of the light transmissive member 30, between the covering member 40 and the wavelength converting member 501, between the covering member 40 and the lateral faces of the electrodes 251 and 252 of the light emitting element 20, and between the covering member 40 and the exposed portion of the lower face of the light emitting element 20. In this embodiment, moreover, it may also be formed between the first covering member 401 and the second covering member 402.

Materials for each constituent member of the light emitting devices 10 according to Embodiments 1-2 will be explained below.

Light Emitting Element 20

For the light emitting element 20, a semiconductor light emitting element, such as a light emitting diode, can be used. The semiconductor light emitting element can include a light transmitting substrate 27 and a semiconductor stack 28 formed thereon.

Light Transmitting Substrate 27

For the light transmitting substrate 27 of the light emitting element 20, for example, a light transmissive insulating material, such as sapphire ($Al_2O_3$) or spinel ($MgAl_2O_4$), or a semiconductor material that allows the emitted light from the semiconductor stack 28 to transmit therethrough (e.g., a nitride-based semiconductor material) can be used.

Semiconductor Stack 28

The semiconductor stack 28 includes plural semiconductor layers. As an example, the semiconductor stack 28 can include three semiconductor layers comprising a first conductive type semiconductor layer (e.g., n-type semiconductor layer) 281, a light emitting layer (active layer) 282, and a second conductive type semiconductor layer (e.g., p-type semiconductor layer) 283 as shown in FIG. 4. The semiconductor layers can be formed using, for example, semiconductor materials such as group III-V compound semiconductors, group II-VI compound semiconductors, or the like. More specifically, a nitride-based semiconductor material, such as an $In_XAl_YGa_{1-X-Y}N$ ($0 \leq X$, $0 \leq Y$, $X+Y \leq 1$) or the like (e.g., InN, AlN, GaN, InGaN, AlGaN, InGaAlN, or the like) can be used.

Electrodes 251, 252

For the electrodes 251, 252 of the light emitting element 20, a good conductor of electricity can be used, and for example, a metal such as Cu, Au, Ag, Ni, Sn, or the like, is suitable.

The two electrodes 251 and 252 comprising a pair of electrodes can have any shape. In the light emitting device 10 shown in FIGS. 1-2, for example, each of the electrodes 251 and 252 may be a rectangular parallelepiped extending in one direction (i.e., y direction). The electrodes 251 and 252 may have different shapes. Moreover, the electrodes 251 and 252 can be arranged in any way, so long as they are spaced apart. As shown in FIG. 4, the two electrodes 251 and 252 in the embodiment are arranged in parallel so that the longitudinal axis of each electrode coincides with y direction.

Light Transmissive Member 30

The light transmissive member 30 can be formed from a light transmissive material, such as a light transmissive resin, glass, or the like. For the light transmissive resin, thermosetting light transmissive resins, such as silicone resins, silicone modified resins, epoxy resins, phenol resins, and the like are preferable. Since the light transmissive member 30 is in contact with the lateral faces 23 of the light emitting element 20, it is readily affected by the heat generated at the light emitting element 20 when turned on. Thermosetting resins have highly heat resistant, and thus are suited for the light transmissive member 30. The light transmissive member 30 preferably has high light transmittance. For this reason, it is preferable not to add any additives that reflect, absorb, or scatter the light to the light transmissive member 30. However, there are instances where an addition of an additive to the light transmissive member 30 is preferable in order to impart desirable properties. For example, various fillers may be added in order to adjust the refractive index of the light transmissive member 30, or the viscosity of the light transmissive member before curing (i.e., liquid resin material 300), for example.

In a plan view of the light emitting device 10 as shown in FIG. 1, the outline of the first face 31 of the light transmissive member 30 is larger than at least the outline of the second face 22 of the light emitting element 20. The outline of the first face 31 of the light transmissive member 30 can be shaped in various ways, and can have for example, a circular shape as shown in FIG. 1, a quadrangle with rounded corners as shown in FIG. 12, oval, square, rectangle, or the like.

The outline shape of the first face 31 of the light transmissive member 30 may be determined based on other conditions. For example, when the light emitting device 10 is used in combination with an optical lens (that is, secondary lens), the outline of the first face 31 is preferably circular, which also gives a shape close to a circle to the emission from the light emitting device 10 thereby allowing the optical lens to easily condense the light. On the other hand, if a reduction in the size of the light emitting device 10 is desired, the outline of the first face 31 is preferably a quadrangle with rounded corners, which can reduce the dimensions of the upper face 11 of the light emitting device 10.

Covering Member 40, 403

The covering member 40 or 403 can be formed from an inorganic material, such as glass, resin, or the like, and a resin material is particularly preferable. Resin materials, including thermosetting resins, such as silicone resins, silicone modified resins, epoxy resins, and phenol resins, are particularly suitable.

It is preferable to add additives to the covering member 40 or 403 in order to impart desirable properties. Examples of the additives include a formability enhancer for improving the formability, a reinforcing material for increasing the mechanical strength, and additives for enhancing the heat resistance. Particularly, it is preferable to add carbon black, carbon nanotubes, glass fibers, or the like, for increasing the mechanical strength.

Wavelength Converting Member 50

The wavelength converting member 50 contains a wavelength converting material such as phosphor and a light transmissive material. For the light transmissive material, a light transmissive resin, glass, or the like, can be used. Light transmissive resins are particularly preferable, and thermosetting resins, such as silicone resins, silicone modified resins, epoxy resins, phenol resins, or the like, as well as thermoplastic resins, such as polycarbonate resins, acrylic resins, methylpentane resins, polynorbornene resins, or the like, can be used. Silicone resins which have good light resistance and heat resistance are particularly suitable.

For phosphors, those that can be excited by the emitted light from the light emitting element 20 are used. Example of phosphors excitable by light emits from a blue light emitting element or ultraviolet light emitting element include cerium-activated yttrium aluminum garnet-based phosphors (Ce:YAG); cerium-activated lutetium aluminum garnet-based phosphors (Ce:LAG); europium- and/or chromium-activated nitrogen-containing calcium aluminosilicate-based phosphors (CaO—$Al_2O_3$—$SiO_2$); europium-activated silicate-based phosphors ($(Sr,Ba)_2SiO_4$); nitride-based phosphors, such as β-SiAlON phosphors, CASN-based phosphors, SCASN-based phosphors; KSF-based phosphors ($K_2SiF_6$:Mn); sulfide-base phosphors, and quantum dot phosphors. By combining these phosphors with a blue or ultraviolet light emitting element, light emitting devices of various emission colors (e.g., a white light emitting device) can be produced.

The wavelength converting member 50 may contain various fillers for the purpose of adjusting the viscosity or the like.

The surface of the light emitting element may be covered by a light transmissive material containing no phosphors, in lieu of the wavelength converting member 50. This light transmissive material may also contain various fillers for the purpose of adjusting the viscosity or the like.

Light reflective film 70 (First reflective film portion 71, Second reflective film portion 72, Third reflective film portion 73, and Fourth reflective film portion 74)

Each of the reflective films making up the light reflective film 70 (that is, the first reflective film portion 71, second reflective film portion 72, third reflective film portion 73, and fourth reflective film portion 74) is preferably formed from an inorganic material.

Each reflective film can be formed with a material having a high optical reflectance selected from among metal or insulating materials. Insulating materials also includes dielectric multilayer film besides those materials that have high reflectance by themselves. Each type of the materials will be explained in detail below.

Metal Materials

Examples of metal materials suited for each reflective film include silver, silver alloys, aluminum, gold, platinum, and the like. Sulfidation resistant silver alloys are particularly preferable, and any of the silver alloys known in the art may be used. The thickness of the reflective film is not particularly limited, but is preferably a thickness capable of effectively reflecting the light emitted from the light emitting element (e.g., in a range between about 20 nm and about 1 µm), particularly preferably at least 50 nm.

Dielectric Multilayer Film (DBR)

A dielectric multilayer film (DBR) can selectively reflect light having a prescribed wavelength, and has a structure in which two types of dielectric layers having different refractive indices are alternately stacked at a prescribed thickness. Specifically, by alternately stacking on any underlayer made of an oxide film, or the like, low refractive index layers and high refractive index layers at a quarter wavelength thickness of the light to be reflected, the light having the prescribed wavelength can be highly efficiently reflected.

For the dielectric film, for example, an oxide or nitride of at least one selected from the group consisting of Si, Ti, Zr, Nb, Ta, and Al can be used, and the film formation can be achieved by sputtering or CVD. For example, the low refractive index layer can be $SiO_2$, and the high refractive index layer can be $Nb_2O_5$, $TiO_2$, $ZrO_2$, $Ta_2O_5$, or the like. Specific examples include, sequentially from the underlayer side, $(Nb_2O_5/SiO_2)_n$ where n=2-5.

The total thickness of the DBR can be in a range between about 0.2 and about 1 µm.

The light reflective film may alternatively be a layer formed from fine particles in a range between about 10 and 500 nm in particle diameter.

For the fine particle material, a titanium oxide, a zirconium oxide, or the like, which has a high optical reflectance can preferably be used. Examples of the methods for forming the fine particle layer include coating the exterior of the light transmissive member 33 with a mixture of a volatile solvent and fine particles, followed by removing the solvent by evaporation.

The use of fine insulator particles as a reflective film has the advantage of not causing a short circuit even when formed directly on the surfaces of the electrodes 251, 252, and the semiconductor stack 28 as in the case of a dielectric multilayer film. Moreover, by employing a material having a broad reflectable wavelength range, such as titanium oxide, a mixture of the light emitted from the light emitting element 20 and the light which has undergone wavelength conversion by the wavelength converting member 50 can be efficiently reflected as in the case of a metal film.

The first to fourth reflective film portions 71 to 74 may all be formed from a same material, or all from different materials. Furthermore, different materials may compose any of the first to fourth reflective film portions 71 to 74. In the first reflective film portion 71, for example, the portion closer to the third reflective film portion 73 may be formed from a dielectric multilayer film or insulating fine particles which can reduce the risk of short circuits, while forming the portion closer to the second reflective film portion 72 with a metal film.

Several embodiments of the invention have been exemplified in the forgoing. It goes without saying, however, that the invention is not limited to those described above. Other embodiments are possible so long as they do not deviate from the spirit and the scope of the invention.

What is claimed is:

1. A light emitting device comprising:
   a light emitting element having a first face positioned on an emission face side of the light emitting device, a second face opposing the first face, and lateral faces disposed between the first face and the second face, wherein the light emitting element comprises a plurality of electrodes located at a second face side of the light emitting element;
   a light transmissive member formed from a resin-containing material, covering at least a portion of the lateral faces of the light emitting element and having a first face positioned on the emission face side;
   a covering member covering an exterior of the light transmissive member and having a first face positioned on the emission face side;
   a wavelength converting member covering the first face of the light emitting element, the first face of the light transmissive member, and the first face of the covering member; and
   a light reflective film comprising:
      a first reflective film portion made of an inorganic material and disposed between the exterior of the light transmissive member and the covering member,
      a second reflective film portion made of an inorganic material and disposed between the first face of the covering member and the wavelength converting member,
      a third reflective film portion that covers lateral faces of the plurality of electrodes,
   wherein at least one portion of the light reflective film is made from a metal film;
   wherein the covering member covers lateral faces of the plurality of electrodes and an exposed region of the second face of the light emitting element where the plurality of electrodes are not disposed,
   wherein the third reflective film portion is made of an inorganic material and disposed between the lateral faces of the plurality of electrodes and the covering member, and
   wherein the light reflective film further comprises a fourth reflective film portion made of an inorganic material and disposed between the exposed region of the light emitting element and the covering member.

2. The light emitting device according to claim 1, wherein the first reflective film portion and the second reflective film portion are made of a same inorganic material.

3. The light emitting device according to claim 1, wherein two or more of the first reflective film portion, the second reflective film portion, the third reflective film portion, and the fourth reflective film portion are made of a same inorganic material.

4. The light emitting device according to claim 1, wherein at least one portion of the light reflective film is made from a dielectric multilayer film.

5. The light emitting device according to claim 1, wherein the covering member contains one or more reinforcing materials selected from the group consisting of carbon black, carbon nanotubes, and glass fibers.

6. The light emitting device according to claim 1, wherein the exterior of the light transmissive member is outwardly oblique from a second face side of the light emitting element to the emission face side of the light emitting element.

* * * * *